United States Patent [19]

Bean

[11] 3,844,858

[45] Oct. 29, 1974

[54] PROCESS FOR CONTROLLING THE THICKNESS OF A THIN LAYER OF SEMICONDUCTOR MATERIAL AND SEMICONDUCTOR SUBSTRATE

[75] Inventor: Kenneth E. Bean, Richardson, Tex.

[73] Assignee: Texas Instruments Incorporated, Dallas, Tex.

[22] Filed: Dec. 31, 1968

[21] Appl. No.: 788,167

[52] U.S. Cl. .......................... 156/17, 156/8, 156/11
[51] Int. Cl. .............................................. H01l 7/50
[58] Field of Search ........ 156/17, 8, 11, 13; 29/580, 29/577, 473, 476, 483, 574, 583; 317/234, 235

[56] References Cited

UNITED STATES PATENTS

| | | | |
|---|---|---|---|
| 3,171,762 | 3/1965 | Rutz | 148/175 |
| 3,290,753 | 12/1966 | Chang | 29/577 |
| 3,411,200 | 11/1968 | Formigoui | 29/580 |
| 3,457,123 | 7/1969 | Van Pul | 148/1.5 |

OTHER PUBLICATIONS

IBM Tech. Discl. Bulletin Vol. 9, 6 Nov. 1966, pp. 579 and 580, Two-Level Interwiring for Monolithic Circuits, Seto et al.

*Primary Examiner*—William A. Powell
*Attorney, Agent, or Firm*—Harold Levine; James T. Comfort; Gary C. Honeycutt

[57] ABSTRACT

Process permitting control of the thickness of the thin layer of semiconductor material by first forming a slot of a predetermined depth in one surface so that the slot will be exposed during removal of material from the opposite surface should the thickness of the thin layer of semiconductor material become less than the depth of the slot, and a (110) oriented semiconductor substrate having a slot formed therein which is bounded by converging {111} planes.

In a preferred embodiment the thickness control is realized by first preparing the slice of semiconductor material so that at least one of its surfaces has a (100) orientation. There is then formed on the surface of the slice having the (100) orientation an etch-resistant mask having a window opened therethrough such that the window defines on the surface of the slice two lines which are parallel to each other and to lines defined by the intersection of {111} planes with the surface of the slice. Semiconductor material is then removed through the windows by etching to produce a slot having a depth greater than thickness to which the single crystal semiconductor material is to be subsequently processed. A vapor deposited support layer may then be produced on the surface of the slice to which the mask was attached during which process it will fill the slot etched in the semiconductor material through the window. Upon removal of the semiconductor material from the opposite surface of the slice, which may be affected by lapping and polishing, the support layer formed in the slot will become exposed, thus indicating that the thickness of the semiconductor material remaining is equal to or less than the depth of the slot etched in the first surface of the semiconductor material. At the time the first depth control slot is formed in the first surface of the semiconductor slice, there may also be performed a plurality of similar slots, the depth of which are controlled by controlling the width of the window in the etch resistant mask. Thus, as semiconductor material is removed from the slice, the thickness of the material remaining after the removal process can be determined by the number of slots exposed during lapping and polishing.

14 Claims, 26 Drawing Figures

INVENTOR
KENNETH E. BEAN

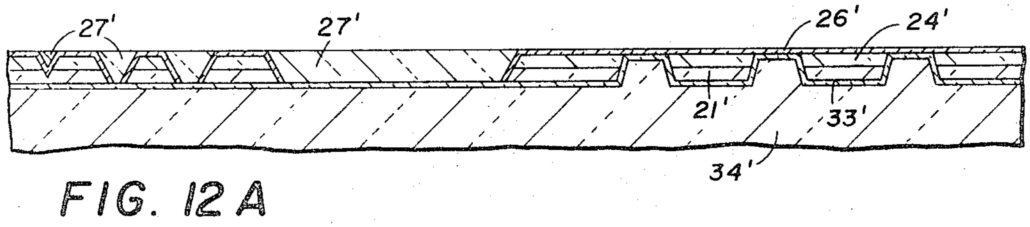
FIG. 12A
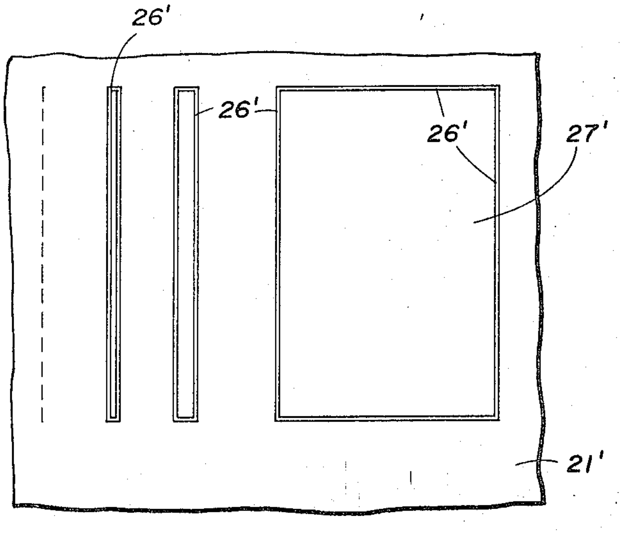
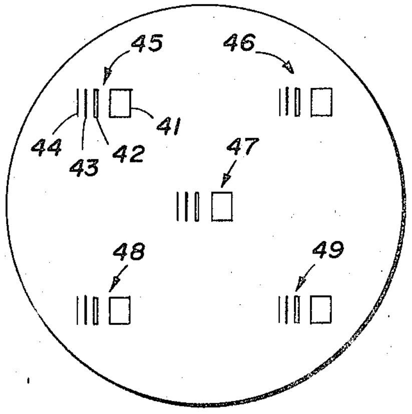
FIG. 13 FIG. 14
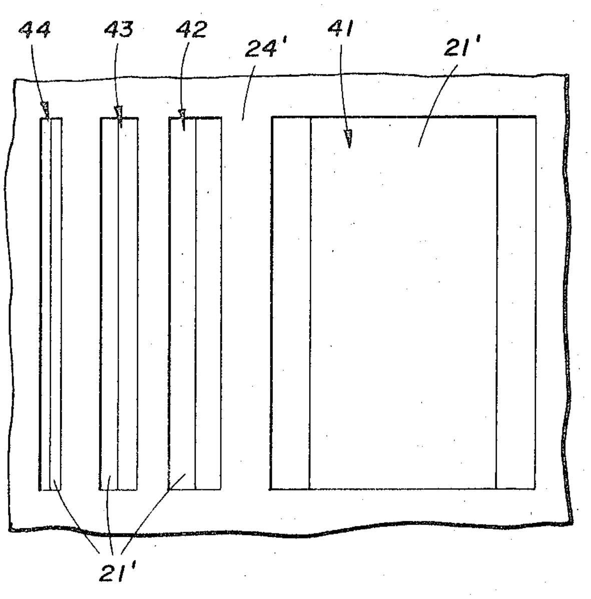
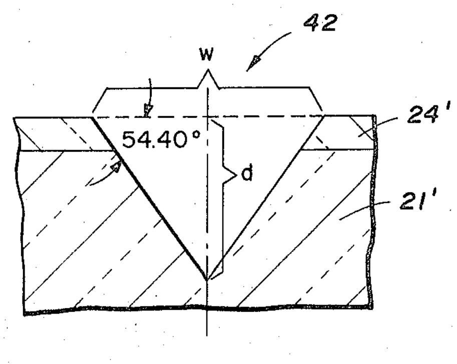
FIG. 15 FIG. 16

PROCESS FOR CONTROLLING THE THICKNESS OF A THIN LAYER OF SEMICONDUCTOR MATERIAL AND SEMICONDUCTOR SUBSTRATE

This invention relates to the process for making semiconductor devices and to a semiconductor substrate produced in such process, and more particularly, to an improved process for making semiconductor devices which permits control of the thickness of a layer of semiconductor material, a portion of which is to be removed. The invention also concerns semiconductor substrates within which have been formed a window having a predetermined depth.

At the present time there is great interest in that area of electronics commonly referred to as "microelectronics." Within the semiconductor field in particular, this interest has been reflected by the rapid development of integrated circuitry. Generally speaking, the area of integrated circuits may be resolved in two broad classes. The first is referred to as the "chip approach" wherein individual components such as transistors, resistors and diodes are formed on separate pieces of semiconductor material. The separate components are thereafter mounted on an insulating substrate and interconnected in a single package to perform a circuit function. The second class, by far having the greater potential due to the greater reliability in performance and substantial savings in cost and space, involves having all of the individual active and/or passive components formed on a single piece of semiconductor material, the components being interconnected to form the desired circuit function.

The formation of all components in one single crystal semiconductor substrate, however, presents the problem of electrically isolating the circuit components from one another. In particular, when a number of transistors are formed within one portion of the substrate, with the substrate forming the collector region, it is necessary for many circuit applications to isolate the transistors to avoid having the collectors commoned.

One method known by those skilled in the art for electrically isolating the circuit components, which may be characterized as the "single support layer" technique, comprises etching a series of mesas upon one face of a monocrystalline semiconductor slice. These mesas are then coated with an insulating medium, such as silicon oxide. A "support layer" is then produced over the silicon oxide which serves to support the single crystal material during subsequent processing. The support layer is in many cases epitaxially deposited polycrystalline silicon. A portion of the single crystal semiconductor material is then removed by lapping and polishing to the extent necessary to expose mesa regions which are isolated from each other and electronically insulated by the silicon oxide layer. Circuit elements such as transistors, resistors or other appropriate devices are then formed in the unremoved monocrystalline portion of the mesa by the usual techniques.

A form of this "single support layer" technique is described in U.S. Pat. No. 3,290,753 issued Dec. 13, 1966. Generally in the single support layer technique described above, the mesa regions are comprised of a layer of N+ type silicon buried under an N type silicon layer which is removed by the lapping step. One of the disadvantages of the technique is that uniformity across the slice is difficult to obtain on the N layer since, in some instances, it is preferable for control of the properties of the semiconductor to be formed in the mesa that the thickness of the N layer be controlled to ± 1 micron thickness. Further, in the mechanical polishing of the N layer there will be surface damage induced from the polishing, rendering it desirably to chemically etch the damaged layer.

An alternate procedure for electrically insulating the semiconducting components which are to be formed on the single slice of semiconductor material may be generally described as the "double support layer" technique, one form of which is described in U.S. Pat. No. 3,332,137 issued July 25, 1967 and another form of which is described in *Electronics Industries*, Vol. 24, No. 6, pp. 38–42 (June 1965). Generally, in the double support layer technique a single crystal substrate of, for example, N+ type material has epitaxially deposited thereon an N− layer which is subsequently covered by silicon oxide. Following the formation of the electrically isolating layer of silicon dioxide, a first support layer is affixed to the oxide, as by depositing polycrystalline silicon over the surface of the oxide. The combined substrate structure is then lapped to remove a portion of the N+ type material to produce a desired thickness. Mesas are then formed through the N+ and N type layers by standard masking and etching techniques, following which the mesas are covered with a silicon oxide layer and a "second supporting layer" deposited over the mesas as by deposition of polycrystalline silicon around and over the mesas. The first support layer is then removed by lapping and polishing to expose the first formed layer of silicon dioxide through which openings may be made by conventional masking and etching techniques to permit formation of the semiconductoring portions of the device, the mesas being electrically insulated or isolated by the silicon dioxide formed therearound and the second supporting layer which is deposited between and over the mesas. As with the single support layer technique, thickness control across the single crystal layer to be lapped and polished is difficult to control during the lapping step.

The present invention is of particular utility in controlling the exact thickness of the layer to be lapped in the above described processes, as well as having utility in determining the thickness of layers to be lapped in other processes for producing semiconducting devices.

The present invention may be generally described as an improvement in the process of producing a plurality of semiconductor devices from a slice of semiconductor material during which a portion of one surface of the slice is to be removed, and is characterized by the steps of forming a slot of predetermined depth in the opposite surface of the slice so that the slot will be exposed during removal of material from the first mentioned surface should the thickness of the layer be less than the depth of the slot.

The invention also comprehends a novel semiconductor substrate such as could be formed by the above process and would comprise a single crystal slice of semiconductor material having a (100) oriented surface with a slot of predetermined depth formed in said surface, the slot having at least two sides bounded by {111} planes and a handle material covering the (100) oriented surface.

For a specific description of an embodiment of the invention, reference is made to the drawings, in which:

FIGS. 2A–12A are cross-sectional views of the semiconductor material of FIG. 1A in various stages of production, during which production the present invention is utilized;

FIGS. 1B, 2B and 5B–12B are cross-sectional views through a portion of a slice of semiconductor material in various stages of production utilizing a conventional double support layer technique for comparison with the process of the present invention.

FIG. 13 is a partial plan view of the semiconductor material at the stage of production illustrated in FIG. 7A;

FIG. 14 is a top plan view of a semiconductor substrate prepared in accordance with one embodiment of the present invention;

FIG. 15 is an enlarged view of a portion of the semiconductor substrate illustrated in FIG. 14; and FIG. 16 is an illustrative cross-sectional view through a slot formed by a preferred embodiment of the present invention.

To clearly define and point out the usefulness and importance of a preferred embodiment of the present invention, comparison will be made between FIGS. 1A–12A and FIGS. 1B, 2B and 5B–12B. FIGS. 1A–12A illustrate how one embodiment of the present invention may be incorporated into the double support layer process, one form of which is illustrated in FIGS. 1B, 2B and 5B–12B.

Figure 1B:
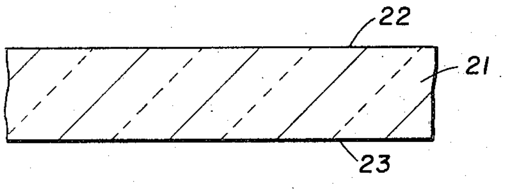
Figure 2B:
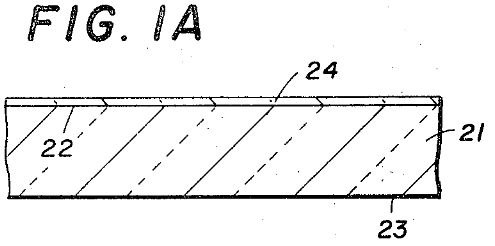
Figure 5B:
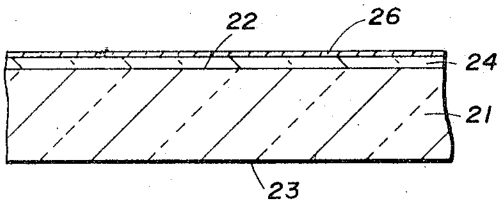
Figure 5A:
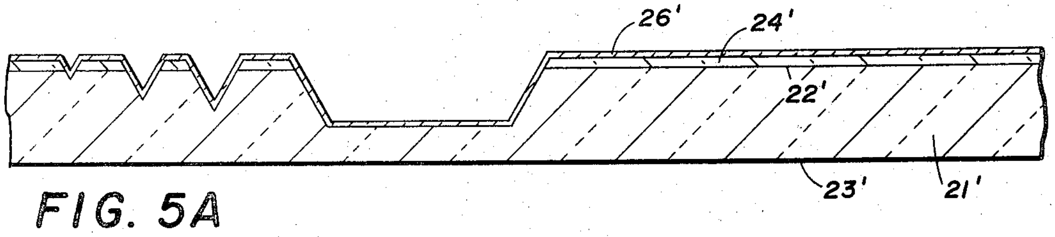

With reference to FIG. 1B, a single crystal slice of silicon 21, which may, for example, be N type silicon is provided with polished surfaces 22 and 23. On surface 22, as illustrated in FIG. 2B, is first epitaxially deposited an N+ silicon layer 24. Next, as illustrated in FIG. 5B, a layer of silicon oxide 26 is formed over the surface of layer 24 by thermal oxidation of layer 24 or in any other conventional manner to serve as a dielectric insulation medium. A first support layer 27 is then attached to the silicon oxide layer. First support layer 27, which may, for example, be formed by depositing polycrystalline silicon over silicon oxide layer 26, is relatively thick in order to serve as a support during subsequent processing of the substrate illustrated in FIG. 6B. Subsequent processing, for example, may comprise the removal of a portion of the N type layer 21 by lapping and polishing to form the structure illustrated in FIG. 7B, the structure illustrated in FIG. 7B being inverted from the position illustrated in FIG. 6B for ease of description. As will be noted from examination of FIG. 7B, it is extremely difficult to determine during the lapping and polishing of the N type silicon layer 21 how much of the material has been removed during the lapping step and to control the thickness of layer 21 so that the thickness is uniform across the surface of the slice. Particularly is the uniformity of thickness a problem with slices which, due to thermal gradients created between layers 24, 26 and 21 during deposition of the support layer 27 become non-planar or warp. Lapping of bowed or warped slices causes removal of more material at some points along the surface than at other points due to non-planarity.

Figure 8B:
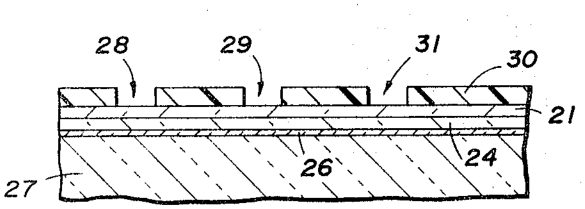
Figure 8A:
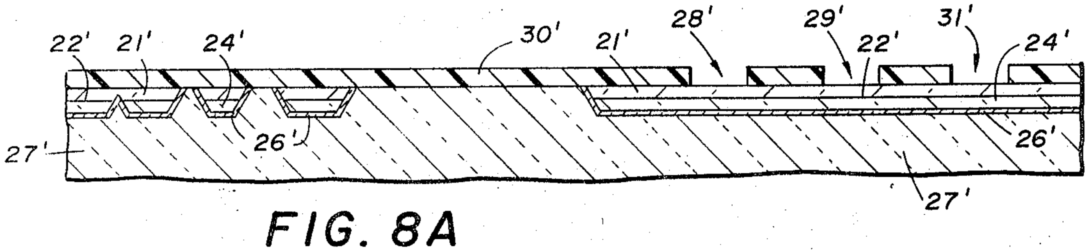
Figure 9B:
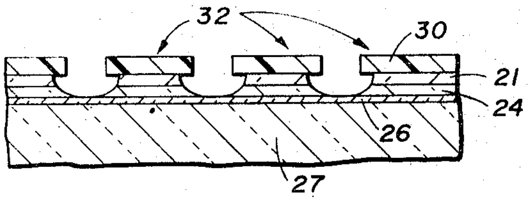
Figure 9A:
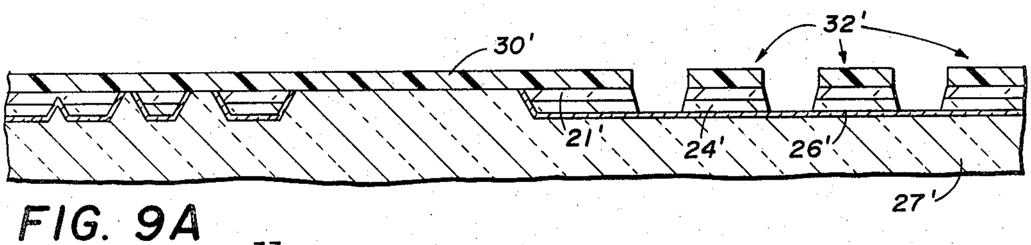
Figure 10B:
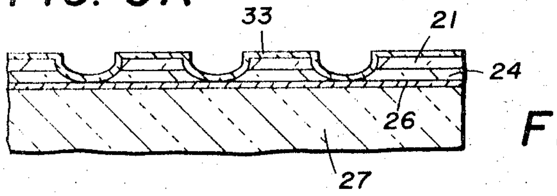
Figure 10A:
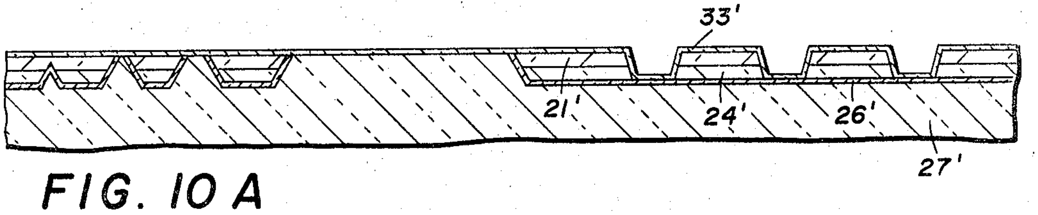

However, once layer 21 has been lapped to the desired thickness, or what is believed to be the desired thickness, a conventional photoresist mask 30 such as a KMER (Kodak Metal Etch Resist) mask or the like is used to produce a pattern on layer 21, which pattern is provided with openings 28, 29 and 31 by conventional exposure and development techniques to produce the composite of FIG. 8B. The composite illustrated in FIG. 8B is then etched to remove those portions of layers 21 and 24 accessible through openings or windows 28, 29 and 31 by use of vapor etching or by use of an acid etchant which will attack layers 21 and 24 but has little reactivity with the silicon oxide insulating layer 26. As illustrated in FIG. 9B, the etchant will form a series of mesas 32 which, after removal of the masking layer 30 are covered with a silicon oxide layer 33. Following formation of silicon oxide layer 33 over mesas 32, a second supporting layer 34, for example polycrystalline silicon, which due to its polycrystalline nature has a high resistivity, is deposited over silicon oxide layer 33. The first supporting layer 27 is then removed by lapping and polishing to expose silicon oxide layer 21 which, as well known to those skilled in the art, may be opened by masking and etching to permit the fabrication of various semiconducting components within each of the mesas 32. Mesas 32 are electrically insulated from each other by silicon oxide layers 33 and the second supporting layer 34. The individual mesas 32, after fabrication of transistors, diodes and/or passive elements such as resistors and P-N juncture capacitors therein, may be interconnected by masking, etching and deposition techniques well known by those skilled in the art to form complete integrated circuits.

By way of contrast, reference is made to FIGS. 1A–12A, FIGS. 1A, 2A and 5A–12A of which correspond to FIGS. 1B, 2B and 5B–12B, respectively, but serve to illustrate the present invention.

Figure 1A:
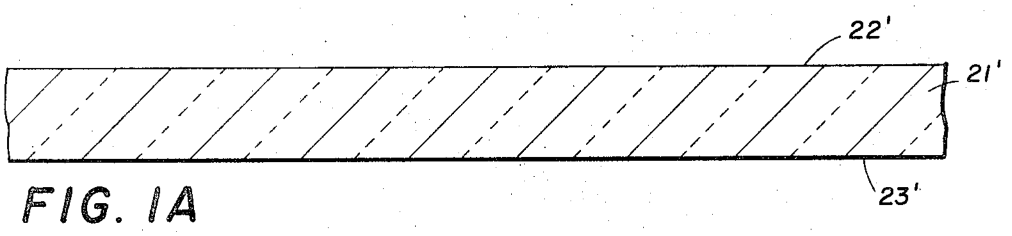
FIG. 1A is a cross-sectional view of a segment of a slice of semiconductor material.
Figure 2A:
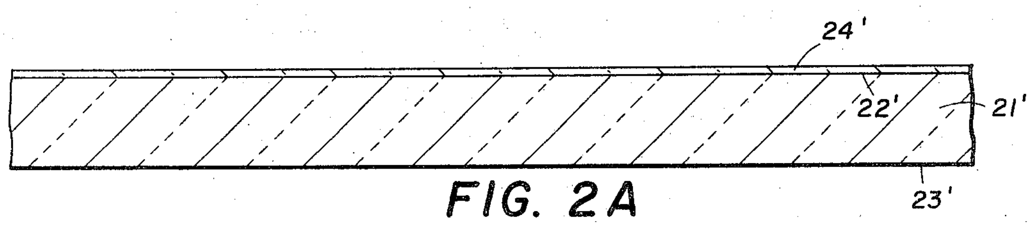
Figure 3A:
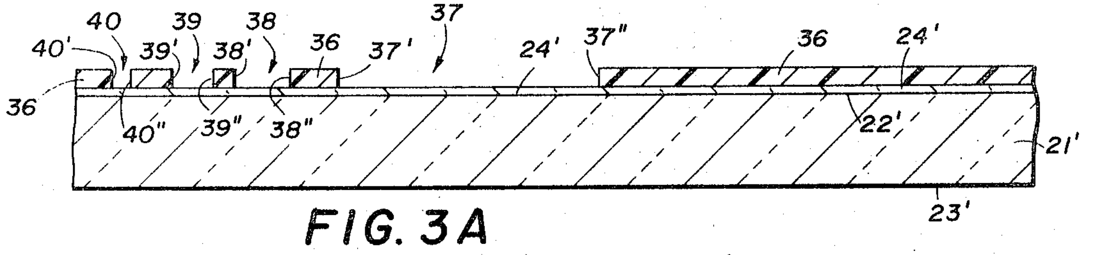

In FIG. 1A the silicon slice 21′ which, for example, may be N type silicon has planar faces 22′ and 23′, both of which have a (100) orientation. A layer 24′ of different conductivity silicon, for example N+ type is epitaxially deposited over surface 22′, as illustrated in FIG. 2A. Over the epitaxially deposited layer 24′ is then formed a mask such as KMER photoresist mask 36 through which is opened, in a conventional manner, windows 37–40. Windows 37–40 are, if viewed from the top of FIG. 3A, rectangular in shape. Window 38 defines an opening which is narrower than that defined by window 37. Window 39 is more narrow than window 38 and window 40 is still more narrow than window 39. Each of the windows 37–40 describe parallel lines 37′ and 37″ through 40′ and 40″, respectively, on layer 24′ which are parallel to lines defined by the intersection of {111} planes with the (100) plane which forms the top surface of layer 24′.

Figure 4A:
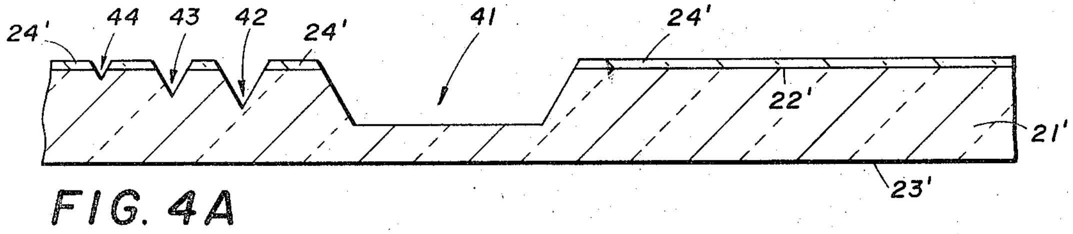

As a result of the alignment of windows 37–40, with the {111} planes, upon etching of layers 24′ and 21′ through windows 37–40, there will be formed a plurality of slots 41–44 the walls of which, as illustrated in FIG. 4A, are bounded by {111} planes. The slots 41–44 may be formed with the sloped sides, as indicated in FIG. 4A, by use of preferential etch solutions, such as those described in *Electrochem Society Journal* (September, 1967) page 965. More specifically, by selection of an etchant solution which preferentially etches {110} and {100} planes rather than the {111} planes, the {110} and {100} planes will be etched faster than the {111} planes causing the sides of slots 41–44 to be bounded by {111} planes. The {111} planes intersect the surface of layers 21' and 24', both of which will have a (100) orientation at an angle of 54.74°, as illustrated in FIG. 16. A particular etching solution which has been found suitable for preferentially etching through windows 37–40 comprises a mixture of 88 ml water (61.20 mole %), 17 ml ethylene diamine (35.1 mole %) and 3gm pyrocatechol (3.7 mole %). This solution will etch {100} planes at about 50 micron per hour, {110} planes at about 30 micron per hour and the {111} planes at about 3 micron per hour. Thus, as explained before, by use of the preferential etching solution the geometry of slots 41–44 may be accurately controlled since they will be bounded by the slow etch {111} planes. The depth of the slots 37–40 is then a function of the period of etch as well as the width of windows 37–40. More specifically, the depth designated by $d$ in FIG. 16 will, assuming that the etchant solution is permitted to contact the layers 24' and 21' for a sufficient period of time, be 0.707 times the width of the window through which it is formed, designated $w$. By control of the width of windows 37–40 the depth of slots 41–44 are controlled. As explained above, since the windows of 37–40 are progressively smaller in width, the resulting etched slots 41–44 are progressively more shallow. The depth of slot 41 is controlled by the duration of the etching period as window 37 is sufficiently wide that the walls of slot 41 will not converge as quickly as slots 42, 43 and 44. As illustrated in FIG. 4A, the period of etch is preferably limited so that the walls of slot 41 do not converge and slot 41 will have, for example, a depth between 1.8 and 2.0 mils. The width of windows 38, 39 and 40 may be so controlled that slots 42, 43 and 44 are respectively 1.25, 1.0 and 0.7 mils deep. Following the etching of slots 41–44 through layers 21' and 24', a layer 26' of silicon oxide is deposited or formed over the portion of layer 24' remaining after the etching step described above as well as over the surfaces of slots 41–44.

Figure 6B:
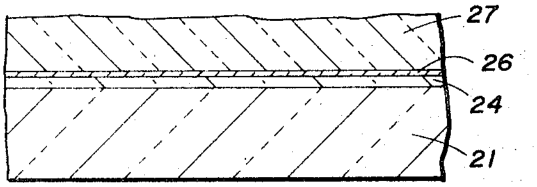
Figure 6A:
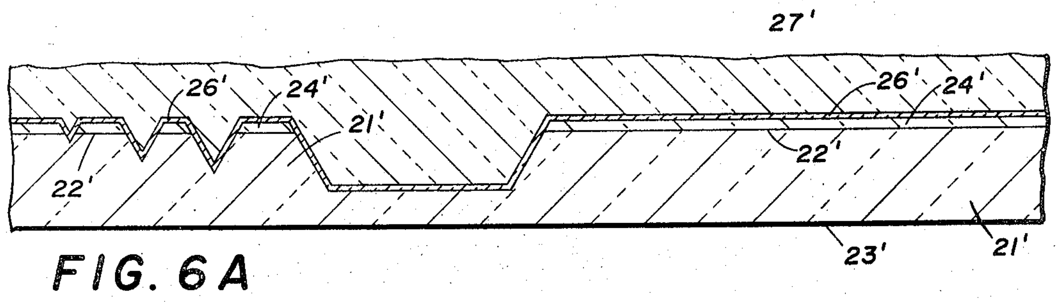

Then, as illustrated in FIG. 6A, a first support layer 27' is formed over the silicon dioxide layer 26', the handle being of any suitable material, such as polycrystalline, silicon, ceramic molten glass or the like. After forming of the first support layer 27', the original layer 21' of N type silicon or the like is lapped to desired thickness. With the slots 41–44 being provided, the thickness to which the layer 21' is lapped may be determined by visual inspection as lapping to a depth of less than 1.8 to 2 mils will expose the silicon oxide layer 26' and polycrystalline silicon 27' formed in slot 41. If the desired thickness of layer 21' is between 0.7 mil and 1.0 mil, layer 21' is lapped until the bottoms of slots 41, 42 and 43 are exposed, such as illustrated in FIG. 13. With reference to FIG. 13, since the bottom of slot 44 has not yet appeared through the surface of layer 21' it can be determined that the thickness of the layer 21' is between 0.7 and 1.0 mil. In order to determine if the thickness of layer 21' is uniform over the entire surface of the slice, a series of the slots 41–44 may be formed at various points spaced about the slice 21', as illustrated in FIG. 14. In FIG. 14 there are provided five sets of slots 41–44 which are uniformly spaced about the surface of the slice so that upon lapping of layer 21' the visual inspection of any one of the sites 45–49 will permit determination of the thickness of the layer 21' at that location. Once layer 21' has been lapped to the desired thickness, procedures described above in connection with FIGS. 8B–12B are followed.

Figure 7B:
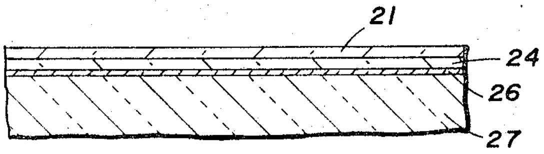
Figure 7A:
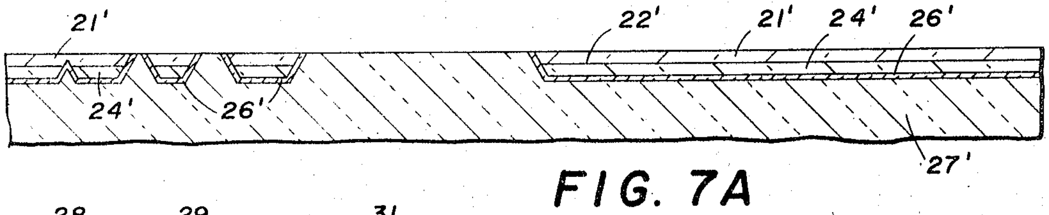
Figure 11B:
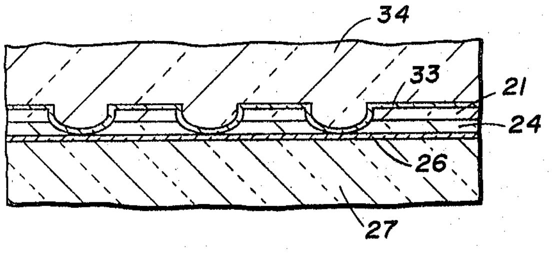
Figure 11A:
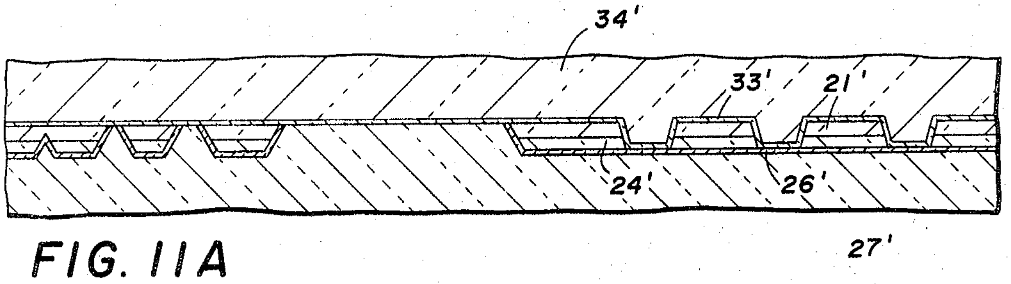
Figure 12B:
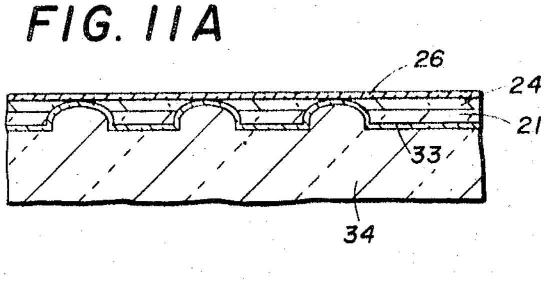

More particularly, a photoresist layer 30' is formed over the substrate illustrated in FIG. 7A and windows 28' and 29' and 31' opened therethrough following which the layer 21' and 24' accessible through such windows may be removed by using a conventional etching solution, though the etching is preferably performed using the preferential etchant described above for reasons to be explained hereafter to produce mesas 32'. A layer of silicon oxide 33' is then formed over the top surface of the substrate illustrated in FIG. 9A following which a second support layer 34', as illustrated in FIG. 11A is deposited over the silicon oxide layer 26'. The second support layer as described above, may comprise, for example, polycrystalline silicon. The polycrystalline silicon which served as the first support layer 27' is then removed by lapping and polishing to expose the silicon dioxide layer 33'. Windows may then be opened through layer 33' for forming semiconducting devices in the mesas 32'. These semiconducting devices may later be connected by techniques well known to those skilled in the art to form integrated circuits.

Each of the mesas 32' is electrically insulated and isolated from each other by the silicon oxide layer 26' as well as the high resistivity polycrystalline layer 34'.

While the present invention is described in connection with the formation of electrically insulated semiconducting devices, it has utility also in the formation of semiconducting devices which are formed on a silicon slice and later separated by scribing and breaking since it can be used to control the thickness of the layer of the semiconductor material in which the semiconducting components are to be formed. Various other uses will appear to those skilled in the art after reading the above.

It can also be appreciated that the slots 41–44, which may be referred to as "lap-stop indicators" may be controlled to provide an indication of various depths by varying the width of the opening for the windows through which the slots are etched, since the depth of the slot is 0.7 times the width of the opening through which the slot is formed, due to the exact crystalgraphic orientation of the (111) planes relative of the (100) surface.

It is also obvious that one, two, three, four or more slots could be utilized depending upon the application.

The semiconductor substrates produced by the present invention, such as illustrated in FIG. 4A are extremely useful in various operations where the layer 21' into which they are etched is to be lapped, and it will be observed that the procedure illustrated and described in connection with FIGS. 1A–12A may be varied to achieve the same results. For example, slots 41–44 could have been formed in the silicon slice 21' before application of the N+ silicon layer 24'. In which event, the epitaxially deposited layer 24' would be applied after formation of the slots 41–44. It will also be obvious that the silicon dioxide electrically insulating layer 26' could have been formed over the substrate illustrated in FIG. 2A before the slots 41–44 were formed therein, all of which is contemplated by the present invention.

While the preferred embodiment of the present invention is described above, it is not necessary to use the {111} planes in order to control the depth to which the depth indicator slots are etched. Due to various factors, the depth to which slots are etched in a single crystal slice of semiconductor material, regardless of the crystal orientation of the slice, may be controlled by control of the width of the window through which the etching is effected. Thus, by controlling the width of windows 37–40, for example, and the etch period, the depth of the slots formed through windows 37–40 may be controlled. A relationship between etch period and window width, once determined, can then be used to etch a single slot of known depth or several slots of known but different depths.

However, the use of converging crystallographic planes or the planes which serve to form the walls of the slots is preferred due to exactness of control which may be realized.

It will be appreciated by those skilled in the art that the invention is useful not only in permitting control of the thickness of the layer 21' during lapping, but, with reference to FIGS. 11A and 12A may also be employed in controlling the thickness of the mesas 32' during removal of the first support layer 27'. More specifically, assuming that mesas 32' are also formed by preferential etching along {111} planes, there can be simultaneously formed one or more slots adjacent the mesa regions which, due to the width of the windows through which they are formed terminate before reaching silicon oxide layer 26'. Thus, in the removal of support layer 27', should these slots become exposed, it is apparent that the semiconductor material remaining in adjacent regions is of a thickness less than the depth of the slots. Of course, as explained above, the depth of these slots may be controlled by control of the width of the window through which they are formed and the etch period, without regard for the crystallographic orientation of the semiconductor material, though such a technique is not preferred.

One of the reasons that the depth indicator slots are preferably bounded by converging planes which intersect the surface of the semiconductor material at a known angle is the precision of control permitted by the use of such slots. With reference to FIG. 13, for example, and assuming only slot 41 had been etched in the substrate of FIG. 4A, it is possible to determine with reasonable accuracy that the semiconductor material remaining after lapping is less than the depth of slot 41 should it become exposed, and how much less the thickness is. This determination is possible since the geometry of the slot 41 is known due to precise angle which the walls of slot 41 make with the (110) surface of the semiconductor material. Knowing the angle, 54.74°, the width of the window 37 through which slot 41 was formed and the width of the opening formed by exposure of slot 41 during the lapping operation, the thickness of the semiconductor material can be calculated. This same principle can be employed to determine the thickness of mesas 32' should the second lapping and polishing operation pass through silicon oxide layer 33' . By measuring the width of mesas 32' exposed during the lapping operation, the angle of the sides and width of the bottom of the mesa being known, the thickness of the mesas 32' may be calculated. A gauging mask could be prepared having configurations thereon which geometrically conform to the configurations of mesas 32', except being of a predetermined minimum dimension could be superimposed over the surface of the substrate illustrated in FIG. 12A. If the portions of mesas 32' exposed by the lapping operation fall within the minimum outline on the gauging mask then it is known that the mesas 32' are too thin as the periphery of mesas 32' will become less as they become thinner due to the angle of the walls of the mesas 32'.

Thus, the invention may be used at a number of different stages of production to permit control of the thickness of the semiconductor material, and other uses will appear to those skilled in the art after reading the above.

While rather specific terms have been used to describe an embodiment of the present invention, they are not intended, nor should they be construed as a limitation upon the invention defined in the following claims.

What is claimed is:

1. A method for thinning a semiconductor slice to a precisely controlled thickness comprising the steps of:

forming a plurality of slots in one surface of said slice, said slots having a precisely known depth equal to or greater than the desired thickness of said slice;

removing material from the opposite surface of said slice until at least a portion of at least one of said slots is exposed; and interrupting said removal of semiconductor material based upon the exposure of said slots as an indication of the thickness of the semiconductor slice.

2. A method as defined in claim 1 wherein said slots are formed by orientation dependent etching.

3. A method as defined by claim 1 wherein the respective depths of said slots are unequal.

4. A method for lapping a semiconductor slice having (100) orientation to provide a precisely controlled thickness, comprising the steps of:

forming on a surface of said slice an etch-resistant mask having a plurality of windows defining on said surface at least two lines which are parallel to each other and parallel to the intersection of {111} planes with said surface, said windows having unequal widths;

subjecting said masked surface to an orientation dependent etch whereby a plurality of slots of precisely determined depths are formed in said slice, said depths being determined by the respective widths of said windows;

lapping the opposite surface of said semiconductor slice until one or more of said slots is exposed; and terminating said lapping to provide a precisely determined slice thickness as indicated by the exposure of said slot or slots.

5. A method as defined by claim 4 wherein said etch resistant mask is provided with a plurality of groups of windows, each group comprising a series of windows having unequal widths.

6. A method as defined in claim 4 wherein the walls of said slots are formed of {111} planes.

7. A method as defined in claim 4 wherein said slots are filled by a vapor-deposited support layer prior to the lapping of the opposite surface.

8. In a method for shaping a body of silicon having first and second sides in the formation of dielectrically isolated integrated circuits so that the body has a precise depth, forming by the use of an anisotropic etch at least two generally V-shaped grooves in said body extending inwardly from said first side of the body so that the grooves have apexes which terminate at different depths in said body within predetermined limits, forming a layer of silicon dioxide on said first side and in the apexes of the grooves, forming a polycrystalline silicon support structure upon said layer of silicon dioxide and removing silicon from the second side of the body using said grooves as depth gauges until at least some of the silicon dioxide in at least one of the apexes of the V-shaped grooves is exposed to thereby give an indication of the depth to which silicon has been removed from said second side of the body.

9. A method as in claim 8, wherein the apexes of the depth gauges differ in depth by approximately 5 microns or less.

10. A method as in claim 8, including forming more than two of said V-shaped grooves in the body of silicon and wherein silicon is removed from the second side of the body until some of the silicon dioxide in the apexes of at least two of the grooves is exposed.

11. A method as in claim 8, including forming active and passive devices in the islands and placing a metallization pattern on the body to interconnect the active and passive devices into an integrated circuit.

12. A method as in claim 8, wherein said silicon is removed from said second side by lapping.

13. A method as in claim 8, including forming isolation moats by the use of an anisotropic etch, which are generally V-shaped in cross-section and extend inwardly from said first side of the body and have a depth which is greater than the depth of any of the V-shaped grooves and forming a layer of silicon dioxide in said moats so that the silicon dioxide layer in the moats provides dielectrically isolated islands of silicon when at least one of the apexes of the V-shaped grooves is exposed.

14. A method as in claim 13 wherein the layer of silicon dioxide in the grooves is formed at the same time that the layer of silicon dioxide is formed in the moats.

* * * * *